Nov. 22, 1966 R. H. BRUNTON III 3,287,665

HIGH SPEED SEMICONDUCTOR MICROWAVE SWITCH

Filed June 25, 1964

INVENTOR.
ROBERT H. BRUNTON III
BY Wade Koontz and Sherman H. Goldman
ATTORNEYS

United States Patent Office 3,287,665

Patented Nov. 22, 1966

3,287,665

HIGH SPEED SEMICONDUCTOR MICROWAVE SWITCH

Robert H. Brunton III, West Acton, Mass., assignor to the United States of America as represented by the Secretary of the Air Force Filed June 25, 1964, Ser. No. 378,087
2 Claims. (Cl. 333—7)

This invention relates generally to high speed switching devices in microwave transmission lines and, more particularly, to a semiconductor device to provide high speed switching and/or modulation in such transmission lines. It will be particularly useful in a microwave signal source for high repetition rate and high speed modulation and as auxiliary isolation in duplexing arrangements and diplexing applications.

Briefly, this device makes use of solid state devices for switching by using the variation of the nonlinear impedance of diodes by appropriate value of bias. It consists essentially of two diodes placed in a rectangular wave guide with means for changing the bias on the diodes which would result in an output pulse length which can be from .2 microsecond to approximately 5 microseconds duration, and with a pulse repetition rate which can be from 100 cycles to over 100 kc. p.s.

Among the objects of the invention are to provide an improved means and method for switching ultrahigh frequency waves in a wave guide transmission system.

Another object is to provide an improved means and method to provide high speed switching of attenuation in a microwave transmission line from low to high values.

Still another object of the invention is to provide a device which can provide both switching and modulation capabilities in microwave transmission lines.

A further object of the invention is to provide a simple means which can be manufactured from readily available parts and material for use with microwave signal sources to provide a high repetition rate, a high speed modulation rate and auxiliary isolation in duplexing and diplexing applications.

These and other advantages, features and objects of the invention will become more apparent from the following description taken in connection with the illustrative embodiments in the accompanying drawings, wherein.

While this invention can be used with any wave guide for any frequency, it will be described as applying to a conventional RG 50/U rectangular wave guide.

Figure 1:
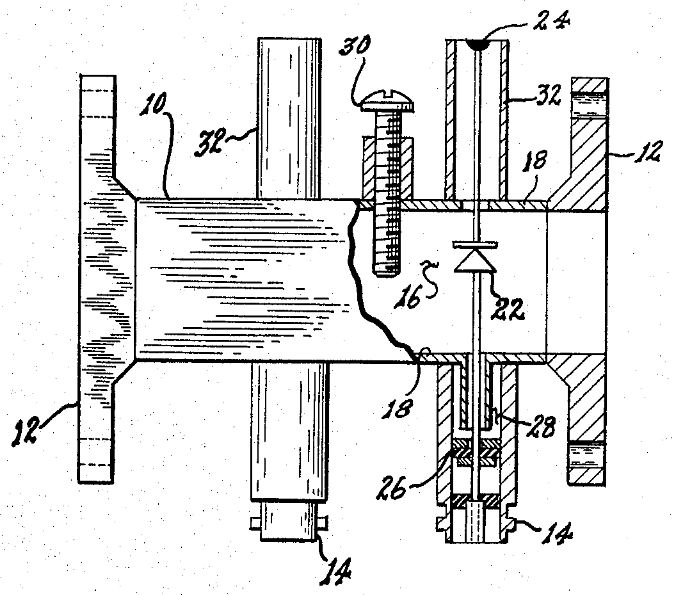
FIGURE 1 is a plan view, partly in section, showing the microwave switch of this invention.

In FIGURE 1, 10 represents a three-inch section of a RG 50/U wave guide with coupling flanges 12 for coupling to a transmission line. A pair of female connectors 14 of the BNC type are shown extending from the broad face 18 of the wave guide 10 and each provides connection for one pigtail of a diode 22, which in this case may be of the 1N419 type. The other end of diode 22 is provided with a movable short to ground at 24 in a tuning stub 32. In the connection to the diode 22 to the center conductor of the BNC connector 14 is shown a bypass capacitor 26 and an RF choke 28. A capacitive post or tuning screw 30 which serves as a tuning device is inserted into the cavity 16 midway between the two doides. In use, this screw or post is adjusted for minimum insertion loss with the switch "on" or in the signal passing condition.

Figure 3:
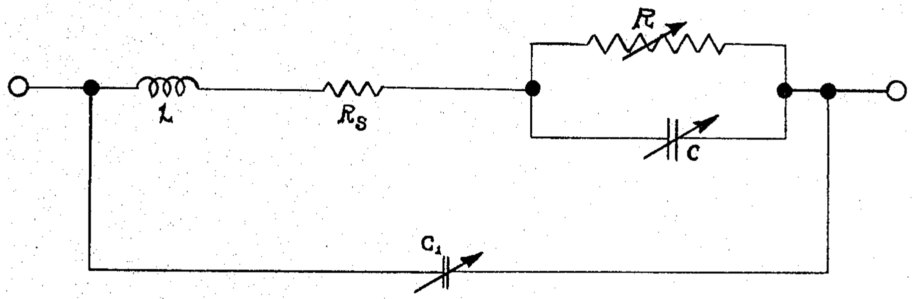
FIGURE 3 is an equivalent RLC circuit representative of the diode and composed of nonlinear parameters.

Switching action is accomplished through the variation of the nonlinear impedance of the crystals by appropriate values of bias. The network representation of the crystal is an RLC circuit as shown in FIGURE 3. By changing the bias from a high forward bias to a reverse bias, both the reactive and resistive components of the circuit are radically changed. A large forward bias will decrease the nonlinear resistance (shunting the capacitive reactance) and will result in a high effective diode impedance, because of the series RL circuit shunting the wave guide. This condition results in a small mismatch and insertion loss.

When the diode is reverse biased, nonlinear resistance is very large. The nonlinear resistance R is shunted by the capacitive reactance. The equivalent circuit then becomes a series RLC circuit. At resonance the diode is a very low RF impedance shunting the wave guide similar to a short circuit which would cause a high mismatch and insertion loss in the diode.

Figure 2:
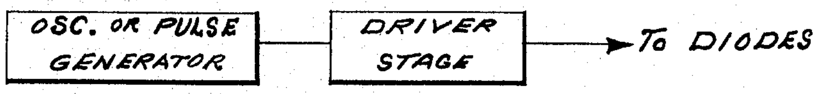
FIGURE 2 is a block diagram showing an oscillator feeding a driver which furnishes bias to the diodes of the wave guide.

The driver stage in FIGURE 2 is a transistorized square wave amplifier and has conventional input designed as a buffer to minimize loading on the pulse generator. The pulse generator may be any of several conventional square wave generators. The output pulse to the driver can be adjusted from .2 microsecond to approximately 5 microseconds duration and the pulse repetition rate can be from 100 cycles to over 100 kc. p.s.

In a test run on this switch at 5,585 megacycles with a reverse bias, an attenuation of 74 db was obtained. With a forward bias, attenuation was reduced to 1.25 db.

While in FIGURE 1, only one diode has been shown, a second diode of the same type is similarly placed with respect to its tuning stub 32, the wave guide 10, and connector 14 such that both diodes are placed in the guide perpendicular to the broad faces thereof and midway between the narrow faces. The diodes are separated by one-quarter wavelength and would be operated in parallel.

Thus, I have shown a novel device for switching or modulating a microwave signal passing through a wave guide using the variation of the nonlinear impedance of a pair of diodes by appropriate value of bias. By using a pair of diodes with a pair of tuning stubs a quarter wavelength apart, separated by a capacitive tuning screw, a broader band of frequencies can be accommodated and more power dissipated in switching than in previous high speed switching devices.

I claim:

1. A high speed switching device for microwaves: comprising a section of microwave guide having a rectangular shape with two parallel broad faces and two parallel narrow faces; a pair of tuning stubs placed perpendicularly in said broad faces of said wave guide equidistant from said narrow faces and one quarter of a wavelength apart; a pair of connectors having center conductors mounted on said wave guide opposed to said stubs; a pair of diodes secured in the center of said wave guide with one connection of each of said diodes being movably shorted to said tuning stub, the other connection of each of said diodes being electrically connected to the center conductor of a connector through a choke and bypass capacitor; means to vary the bias on said diodes which is capable of amplifying pulses from .2 to 5 microseconds and from 100 cycles to 100 kilocycles per second; a capacitive post threaded into said wave guide midway between said diodes; and means to vary the bias on said diodes to take advantage of the nonlinear impedance characteristic thereof to pass or shunt RF current in said wave guide.

2. A high speed switch as described in claim 1 wherein the means for varying the bias to the diodes is a pulse generator.

References Cited by the Examiner

UNITED STATES PATENTS

| | | | |
|---|---|---|---|
| 3,076,155 | 1/1963 | Parker | 333—7 |
| 3,164,792 | 1/1965 | Georgiev | 333—73 |
| 3,175,218 | 3/1965 | Goebels | 343—768 |

HERMAN KARL SAALBACH, *Primary Examiner.*

L. ALLAHUT, *Assistant Examiner.*